(12) United States Patent
Tan et al.

(10) Patent No.: US 11,328,499 B2
(45) Date of Patent: May 10, 2022

(54) NAVIGATION DEVICE WITH CONSISTENT OUTPUT AND 2-STAGE MOVING AVERAGE FILTER THEREOF

(71) Applicant: PixArt Imaging Inc., Hsin-Chu County (TW)

(72) Inventors: Zi-Hao Tan, Penang (MY); Kevin Len-Li Lim, Penang (MY)

(73) Assignee: PIXART IMAGING INC., Hsin-Chu County (TW)

( * ) Notice: Subject to any disclaimer, the term of this patent is extended or adjusted under 35 U.S.C. 154(b) by 0 days.

(21) Appl. No.: 17/151,305

(22) Filed: Jan. 18, 2021

(65) Prior Publication Data
US 2021/0142088 A1 May 13, 2021

Related U.S. Application Data

(63) Continuation of application No. 16/592,282, filed on Oct. 3, 2019, now Pat. No. 10,929,701.

(51) Int. Cl.
| | |
|---|---|
| *G06F 3/01* | (2006.01) |
| *G06F 3/0346* | (2013.01) |
| *G06F 3/038* | (2013.01) |
| *G06V 10/22* | (2022.01) |
| *H03H 17/02* | (2006.01) |
| *G06V 10/20* | (2022.01) |
| *G06F 1/04* | (2006.01) |
| *G06F 3/0354* | (2013.01) |
| *G06F 3/03* | (2006.01) |

(52) U.S. Cl.
CPC ............. *G06V 10/22* (2022.01); *G06V 10/20* (2022.01); *H03H 17/026* (2013.01); *G06F 1/04* (2013.01); *G06F 3/0304* (2013.01); *G06F 3/0354* (2013.01)

(58) Field of Classification Search
CPC ...... G06K 9/2054; G06K 9/60; H03H 17/026; G06F 1/04; G06F 3/0354; G06F 3/0333; G06F 3/0304; G06F 3/0346; G06F 3/038; G06F 3/0383; G06F 3/0386
See application file for complete search history.

(56) References Cited

U.S. PATENT DOCUMENTS

| | | | |
|---|---|---|---|
| 2005/0249449 A1* | 11/2005 | Welch | G06F 3/0317 385/14 |
| 2010/0315337 A1* | 12/2010 | Ferren | G06F 3/0338 345/158 |
| 2015/0364109 A1* | 12/2015 | Jain | G06F 3/017 345/156 |
| 2016/0218697 A1* | 7/2016 | Chin | H03H 17/026 |

* cited by examiner

*Primary Examiner* — Michael J Eurice
(74) *Attorney, Agent, or Firm* — WPAT, PC

(57) ABSTRACT

There is provided a 2-stage moving average filter for a navigation device including a delta regulator and an N-taps average circuit. The delta regulator is used as a first stage to receive motion delta at a varied frequency, and combine or split the received motion delta to output a regulated motion delta at a fixed frequency. The N-taps average circuit receives and averages N regulated motion delta and outputs the averaged motion delta at a fixed frequency.

15 Claims, 5 Drawing Sheets

| frame rate (Hz) | frame period (ms) | motion delta | Moving Average (2 Taps) | MCU poll Delta @ 8ms |
|---|---|---|---|---|
| 250 | 4 | 16 | | |
| 250 | 4 | 16 | 16 | |
| 250 | 4 | 16 | 16 | |
| 250 | 4 | 16 | 16 | 32 |
| 250 | 4 | 16 | 16 | |
| 250 | 4 | 16 | 16 | 32 |
| 500 | 2 | 8 | 12 | |
| 500 | 2 | 8 | 8 | |
| 500 | 2 | 8 | 8 | |
| 500 | 2 | 8 | 8 | 44 |
| 500 | 2 | 8 | 8 | |
| 1000 | 1 | 4 | 6 | |
| 1000 | 1 | 4 | 4 | |
| 1000 | 1 | 4 | 4 | |
| 1000 | 1 | 4 | 4 | |
| 1000 | 1 | 4 | 4 | 38 |
| 1000 | 1 | 4 | 4 | |
| 1000 | 1 | 4 | 4 | |
| 1000 | 1 | 4 | 4 | |
| 1000 | 1 | 4 | 4 | |
| 1000 | 1 | 4 | 4 | |
| 1000 | 1 | 4 | 4 | |
| 1000 | 1 | 4 | 4 | 32 |

FIG. 1(Prior Art)

| frame rate (Hz) | frame period (ms) | motion delta | 1st moving average (4ms) | 2nd moving average (2 Taps) | MCU poll Delta @ 8ms |
|---|---|---|---|---|---|
| 250 | 4 | 16 | 16 | | |
| 250 | 4 | 16 | 16 | 16 | |
| 250 | 4 | 16 | 16 | 16 | |
| | | | | | 32 |
| 250 | 4 | 16 | 16 | 16 | |
| 250 | 4 | 16 | 16 | 16 | |
| | | | | | 32 |
| 250 | 4 | 16 | 16 | 16 | |
| 500 | 2 | 8 | | | |
| 500 | 2 | 8 | 16 | 16 | |
| 500 | 2 | 8 | | | |
| | | | | | 32 |
| 500 | 2 | 8 | 16 | 16 | |
| 500 | 2 | 8 | | | |
| 1000 | 1 | 4 | | | |
| 1000 | 1 | 4 | 16 | 16 | |
| 1000 | 1 | 4 | | | |
| 1000 | 1 | 4 | | | |
| 1000 | 1 | 4 | | | |
| | | | | | 32 |
| 1000 | 1 | 4 | 16 | 16 | |
| 1000 | 1 | 4 | | | |
| 1000 | 1 | 4 | | | |
| 1000 | 1 | 4 | | | |
| 1000 | 1 | 4 | 16 | 16 | |
| 1000 | 1 | 4 | | | |
| 1000 | 1 | 4 | | | |
| 1000 | 1 | 4 | | | 32 |

FIG. 3

| frame rate (Hz) | frame period (ms) | motion delta | 1st moving average (1ms) | 2nd moving average (8 Taps) | MCU poll Delta @ 8ms |
|---|---|---|---|---|---|
| | | | 4 | | |
| | | | 4 | | |
| | | | 4 | | |
| 250 | 4 | 16 | 4 | | |
| | | | 4 | | |
| | | | 4 | | |
| | | | 4 | | |
| 250 | 4 | 16 | 4 | 4 | |
| | | | 4 | 4 | |
| | | | 4 | 4 | |
| | | | 4 | 4 | |
| 250 | 4 | 16 | 4 | 4 | |
| | | | 4 | 4 | |
| | | | 4 | 4 | |
| | | | 4 | 4 | 32 |
| 250 | 4 | 16 | 4 | 4 | |
| | | | 4 | 4 | |
| | | | 4 | 4 | |
| | | | 4 | 4 | |
| 250 | 4 | 16 | 4 | 4 | |
| | | | 4 | 4 | |
| | | | 4 | 4 | |
| | | | 4 | 4 | 32 |
| 250 | 4 | 16 | 4 | 4 | |
| | | | 4 | 4 | |
| 500 | 2 | 8 | 4 | 4 | |
| | | | 4 | 4 | |
| 500 | 2 | 8 | 4 | 4 | |
| | | | 4 | 4 | |
| 500 | 2 | 8 | 4 | 4 | |
| | | | 4 | 4 | 32 |
| 500 | 2 | 8 | 4 | 4 | |
| | | | 4 | 4 | |
| 500 | 2 | 8 | 4 | 4 | |
| 1000 | 1 | 4 | 4 | 4 | |
| 1000 | 1 | 4 | 4 | 4 | |
| 1000 | 1 | 4 | 4 | 4 | |
| 1000 | 1 | 4 | 4 | 4 | |
| 1000 | 1 | 4 | 4 | 4 | 32 |
| 1000 | 1 | 4 | 4 | 4 | |
| 1000 | 1 | 4 | 4 | 4 | |
| 1000 | 1 | 4 | 4 | 4 | |
| 1000 | 1 | 4 | 4 | 4 | |
| 1000 | 1 | 4 | 4 | 4 | |
| 1000 | 1 | 4 | 4 | 4 | |
| 1000 | 1 | 4 | 4 | 4 | |
| 1000 | 1 | 4 | 4 | 4 | 32 |

FIG. 4

| frame rate (Hz) | frame period (ms) | motion delta | 1st moving average (2ms) | 2nd moving average (4 Taps) | MCU poll Delta @ 8ms |
|---|---|---|---|---|---|
| | | | 8 | | |
| 250 | 4 | 16 | 8 | | |
| | | | 8 | | |
| 250 | 4 | 16 | 8 | 8 | |
| | | | 8 | 8 | |
| 250 | 4 | 16 | 8 | 8 | |
| | | | 8 | 8 | |
| 250 | 4 | 16 | 8 | 8 | 32 |
| | | | 8 | 8 | |
| 250 | 4 | 16 | 8 | 8 | |
| | | | 8 | 8 | |
| 250 | 4 | 16 | 8 | 8 | 32 |
| 500 | 2 | 8 | 8 | 8 | |
| 500 | 2 | 8 | 8 | 8 | |
| 500 | 2 | 8 | 8 | 8 | |
| 500 | 2 | 8 | 8 | 8 | 32 |
| 500 | 2 | 8 | 8 | 8 | |
| 1000 | 1 | 4 | | | |
| 1000 | 1 | 4 | 8 | 8 | |
| 1000 | 1 | 4 | | | |
| 1000 | 1 | 4 | | | |
| 1000 | 1 | 4 | 8 | 8 | 32 |
| 1000 | 1 | 4 | | | |
| 1000 | 1 | 4 | 8 | 8 | |
| 1000 | 1 | 4 | | | |
| 1000 | 1 | 4 | 8 | 8 | |
| 1000 | 1 | 4 | | | |
| 1000 | 1 | 4 | 8 | 8 | |
| 1000 | 1 | 4 | | | |
| 1000 | 1 | 4 | 8 | 8 | 32 |

FIG. 5

NAVIGATION DEVICE WITH CONSISTENT OUTPUT AND 2-STAGE MOVING AVERAGE FILTER THEREOF

CROSS REFERENCE TO RELATED APPLICATION

This application is a continuation application of U.S. patent application Ser. No. 16/592,282 filed on Oct. 3, 2019, the full disclosure of which is incorporated herein by reference.

BACKGROUND

1. Field of the Disclosure

This disclosure generally relates to a navigation device and, more particularly, to a navigation device that has a 2-stage moving average filter to generate consistent outputs under varied frame rate.

2. Description of the Related Art

A moving average filter (MAF) can be implemented in a mouse sensor to smoothen the mouse sensor's output (or referred to motion delta) by averaging the motion delta over a number of frames each producing one set of motion delta in X and Y axes. The number of frames used for motion delta averaging is generally referred as taps. An external MCU typically polls or reads the motion delta from the mouse sensor in a period longer than the mouse sensor's frame period. Therefore, an accumulator is implemented to accumulate the averaged motion delta before being read out.

Referring to FIG. 1, it is an operational schematic diagram of a conventional moving average filter. FIG. 1 shows a mouse having a 2-taps averaging circuit and an MCU having 8 ms polling period. The mouse is assumed to move at a constant velocity such as 4 pixels/1 ms. When the frame rate is at 250 Hz, the averaging circuit receives one motion delta every 4 ms, and the MCU polls accumulated motion delta, e.g., 32 pixels, every 8 ms. If the frame rate is fixed at 250 Hz, the MCU can poll the accumulated motion delta in consistent with the motion delta of the mouse. However, if the frame rate is increased, e.g., from 250 Hz to 500 Hz or even to 1000 Hz, the averaging circuit receives more than 2 motion delta within one polling period to cause the MCU to poll the accumulated motion delta no longer in consistent with the motion delta of the mouse.

Accordingly, it is necessary to provide a navigation device capable of outputting consistent motion delta even though a dynamic frame rate sensor is adopted.

SUMMARY

The present disclosure provides a navigation device that adopts a 2-stage moving average filter applicable to a dynamic frame rate sensor.

The present disclosure further provides a 2-stage moving average filter for a navigation device in which a first stage is used to combine or split motion delta to allow a second stage to receive a regulated motion delta at a fixed period even though the frame rate of an image sensor is changed.

The present disclosure provides a navigation device including an image sensor, a delta calculator, a delta regulator, an N-taps average circuit, an accumulator and a bypass path. The image sensor is configured to output image frames based on a dynamic frame period. The delta calculator is configured to generate a motion delta at the dynamic frame period. The delta regulator is configured to combine the calculated motion delta generated at the dynamic frame period when the dynamic frame period is smaller than a fixed period, and output the combined motion delta at the fixed period. The N-taps average circuit is configured to receive the combined motion delta every fixed period for N times and average the N combined motion delta. The accumulator is connected downstream of the N-taps average circuit, and configured to receive and accumulate the averaged motion delta before the accumulated motion delta is polled at a polling period that is an integer times of the fixed period, wherein the polling period is larger than the fixed period. The bypass path is configured to bypass the delta regulator and directly connect the delta calculator to the N-taps average circuit when the dynamic frame period is equal to the fixed period.

The present disclosure further provides a navigation device including an image sensor, a delta calculator, a delta regulator, an N-taps average circuit, an accumulator and a bypass path. The image sensor is configured to output image frames based on a dynamic frame period. The delta calculator is configured to generate a motion delta at the dynamic frame period. The delta regulator is configured to split the calculated motion delta generated at the dynamic frame period when the dynamic frame period is larger than a fixed period, and output the split motion delta at the fixed period. The N-taps average circuit is configured to receive the split motion delta every fixed period for N times and average the N split motion delta. The accumulator is connected downstream of the N-taps average circuit, and configured to receive and accumulate the averaged motion delta before the accumulated motion delta is polled at a polling period that is an integer times of the fixed period, wherein the polling period is larger than the fixed period. The bypass path is configured to bypass the delta regulator and directly connect the delta calculator to the N-taps average circuit when the dynamic frame period is equal to the fixed period.

The present disclosure further provides a 2-stage moving average filter for a navigation device. The 2-stage moving average filter is configured to receive motion delta, and includes a delta regulator and an N-taps average circuit. The delta regulator is configured to receive the motion delta at a dynamic frame period and output a regulated motion delta at a fixed period. The N-taps average circuit is connected downstream of the delta regulator, and configured to receive the regulated motion delta every fixed period for N times and average the N regulated motion delta. The averaged motion delta is configured to be accumulated by an accumulator of the navigation device before the accumulated motion delta is polled at a polling period that is an integer times of the fixed period, wherein the polling period is larger than the fixed period. The motion delta is directly received by the N-taps average circuit to be averaged by bypassing the delta regulator with a bypass path when the dynamic frame period is equal to the fixed period.

In the present disclosure, the 2-stage moving average filter receives motion delta (e.g., displacement calculated by comparing two image frames) at a varied frequency but outputs averaged motion delta at a fixed frequency. In this way, the accumulator connected downstream of the 2-stage moving average filter accumulates the averaged motion delta for an unchanged number of times within a polling period of an external MUC even under a dynamic frame rate.

BRIEF DESCRIPTION OF THE DRAWINGS

Other objects, advantages, and novel features of the present disclosure will become more apparent from the following detailed description when taken in conjunction with the accompanying drawings.

FIG. 1 is an operational schematic diagram of a conventional moving average filter.

FIG. 3 is an operational schematic diagram of a moving average filter for a navigation device according to one embodiment of the present disclosure.

FIG. 4 is an operational schematic diagram of a moving average filter for a navigation device according to another embodiment of the present disclosure.

FIG. 5 is an operational schematic diagram of a moving average filter for a navigation device according to an alternative embodiment of the present disclosure.

DETAILED DESCRIPTION OF THE EMBODIMENT

Figure 2:
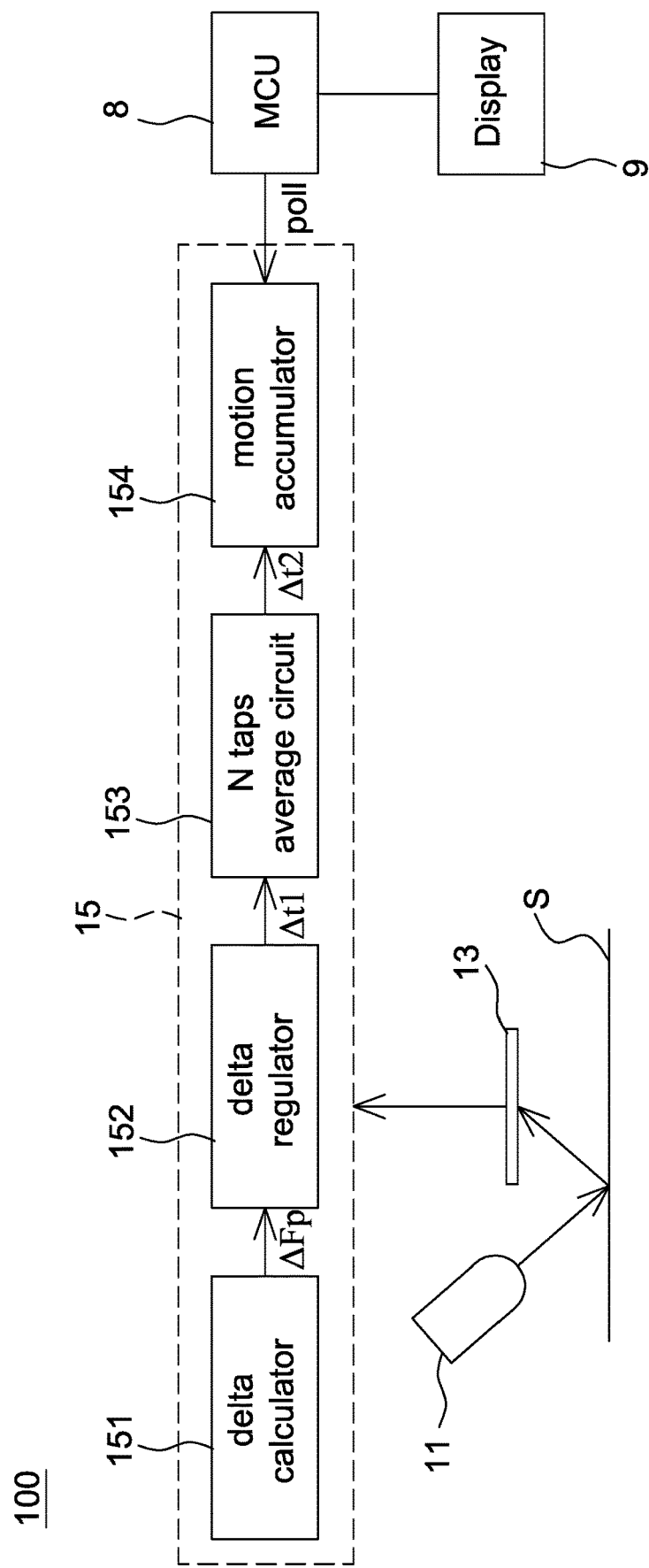
FIG. 2 is a block diagram of a navigation device according to one embodiment of the present disclosure.

It should be noted that, wherever possible, the same reference numbers will be used throughout the drawings to refer to the same or like parts.

The present disclosure provides a navigation device that adopts a 2-stage moving average filter for eliminating inconsistent output motion delta caused by a dynamic frame rate sensor.

Referring to FIG. 2, it is a block diagram of a navigation device 100 according to one embodiment of the present disclosure. The navigation device 100 is operated with respect to a working surface S, wherein at least one of the navigation device 100 and the working surface S has a movement. The navigation device 100 is, for example, an optical mouse or an optical finger mouse, but not limited thereto.

The navigation device 100 includes a light source 11, an image sensor 13 and a processor 15. The processor 15 is electrically connected to the light source 11 to control the lighting thereof. The processor 15 is electrically connected to the image sensor 13 to control the image capturing thereof. In one aspect, the light source 11, the image sensor 13 and the processor 15 is integrated in one encapsulation to form a sensor chip. In another aspect, the processor 15 is integrated in the image sensor 13, e.g., in a base layer forming pixel circuits.

The processor 15 outputs a motion delta (e.g., referred to accumulated motion delta below) to a microcontroller unit (MCU) 8 or a central processing unit (CPU) of an external computer system. Said computer system includes or is connected to a display 9. The light source 11 is a light emitting diode or a laser diode, and used to emit an identifiable spectrum, e.g., infrared light, to illuminate the working surface S. The emission light is reflected by the working surface S to propagate to the image sensor 13. The light source 11 and the image sensor 13 are configured to have a bright field arrangement or a dark field arrangement without particular limitations.

The image sensor 13 is a CCD image sensor, a CMOS image sensor or the like. The image sensor 13 captures and outputs image frames at a dynamic frame rate. For example, the frame rate is changed corresponding to a moving speed and/or acceleration of the navigation device 100 with respect to the working surface S. Therefore, corresponding to different moving speeds and/or accelerations, the image sensor 13 outputs a different number of image frames within a predetermined time interval, referred to the dynamic frame rate herein.

The processor 15 is an application specific integrated circuit (ASIC) or a digital signal processor (DSP). For illustration purposes, the processor 15 is shown to include multiple functional blocks such as a delta calculator 151, a delta regulator 152, an N-taps average circuit 153 and a motion accumulator (sometimes referred to accumulator as a brief) 154. It is appreciated that functions executed by the delta calculator 151, the delta regulator 152, the N-taps average circuit 153 and the motion accumulator 154 are all considered executed by the processor 15. The processor 15 is embedded with software and/or hardware codes to perform the functions thereof. It is appreciated that the navigation device 100 further includes a clock generator to provide a clock signal for the operation of the processor 15.

In the present disclosure, the term "delta" is referred to a motion, displacement or movement between the navigation device 100 and the working surface S. Said delta is calculated by two image frames, e.g., using correlation between successive image frames. In the present disclosure, the motion delta is presented by pixel distance as shown in FIGS. 3-5 for illustration purposes, but the present disclosure is not so limited.

In the present disclosure, the delta regulator 152 and the N-taps average circuit 153 is cascaded to each other to form a 2-stage moving average filter to smoothen the motion delta calculated by the delta calculator 151, wherein the delta regulator 152 is a first stage and the N-taps average circuit 153 is a second stage connected downstream of the delta regulator 152.

Referring to FIGS. 2 and 3 together, FIG. 3 is an operational schematic diagram of a moving average filter for the navigation device 100 according to one embodiment of the present disclosure.

The delta calculator 151 receives image frames at a dynamic frame period $\Delta Fp$, e.g., 4 ms, 2 ms and 1 ms as shown in the second column of FIG. 3. Every time receiving one new image frame, the delta calculator 151 calculates a motion delta using the new image frame and a reference image frame (e.g., a previously received image frame). It is seen from FIG. 3 that the delta calculator 151 generates a motion delta every a dynamic frame period $\Delta Fp$, e.g., every 4 ms, 2 ms or 1 ms.

The 2-stage moving average filter of the present disclosure receives the motion delta at the dynamic frame rate and outputs an averaged motion delta every a fixed period $\Delta t2$ to be accumulated in the motion accumulator 154.

More specifically, the delta regulator 152 receives and then combines the motion delta generated at the dynamic frame period $\Delta Fp$ to generate a combined motion delta when the dynamic frame period $\Delta Fp$ is smaller than a fixed period $\Delta t1$, and outputs the combined motion delta at the fixed period $\Delta t1$ to the N-taps average circuit 153. FIG. 3 shows in the fourth column that the delta regulator 152 outputs one combined motion delta every 4 ms (i.e. the fixed period) when a current frame period (selected from multiple predetermined frame periods) is smaller than 4 ms.

For example, when a current frame period is equal to 2 ms, the delta calculator 151 outputs a motion delta every 2 ms, and the delta regulator 152 combines two motion delta, e.g., two 8-pixels distance herein, to generate a combined motion delta 16-pixels distance every 4 ms. For example, when a current frame period is equal to 1 ms, the delta calculator 151 outputs a motion delta every 1 ms, and the delta regulator 152 combines four motion delta, e.g., four 4-pixels distance herein, to generate a combined motion delta 16-pixels distance every 4 ms.

In the present disclosure, a number of the motion delta outputted from the delta calculator 151 being combined is determined according to the fixed period $\Delta t1$ and a current frame period. And when a difference between the current frame period and the fixed period becomes larger, the number of the motion delta being combined is increased. For example in FIG. 3, as the fixed period $\Delta t1$ is 4 ms, two motion delta are combined when the current frame period is equal to 2 ms, and four motion delta are combined when the current frame period is equal to 1 ms.

Further referring to FIG. 3, the delta regulator 152 further directly transfers the motion delta without being combined to the N-taps average circuit 153 when the dynamic frame period is equal to the fixed period $\Delta t1$. For example, when both the dynamic frame period and the fixed period are 4 ms, the motion delta, e.g., 16-pixels distance, is directly transferred to the N-taps average circuit 153.

The N-taps average circuit 153 (taking N=2 as an example) receives the combined motion delta every the fixed period $\Delta t1$ for 2 times and average the two combined motion delta. Every time the N-taps average circuit 153 obtains an averaged motion delta, e.g., by averaging two combined motion delta herein, the averaged motion delta, e.g., 16-pixels distance, is sent to the motion accumulator 154 based on $\Delta t2$. As shown in FIG. 3, after the N-taps average circuit 153 starts to output averaged motion delta, preferably $\Delta t2$ is equal to $\Delta t1$.

The accumulator 154 receives and accumulates the averaged motion delta before the accumulated motion delta is polled or read. In the present disclosure, the accumulated motion delta is polled at a polling period larger than the fixed period $\Delta t1$. For example in FIG. 3, an external MCU polls or reads the accumulator 154 every 8 ms, i.e. polling period=8 ms. The N-taps average circuit 153 generates an averaged motion delta every 4 ms (i.e. the fixed period $\Delta t2$), two averaged motion delta are accumulated in the accumulator 154 within every polling period. To make the polled or outputted motion delta be in consistent with the motion of the navigation device 100, preferably the polling period is set as an integer times of the fixed period $\Delta t2$, e.g., 2-times herein.

In the present disclosure, as the N-taps average circuit 153 does not output more averaged motion delta (e.g., more than 2 herein) to the motion accumulator 154 when a current frame rate is increased, the polled and outputted motion delta can be in consistent with the motion delta obtained by the delta calculator 151. Accordingly, the accumulated motion delta may control a cursor shown on the display 9 at a constant speed when the motion delta has a constant value.

Referring to FIGS. 2 and 4 together, FIG. 4 is an operational schematic diagram of a moving average filter for the navigation device 100 according to another embodiment of the present disclosure.

The delta calculator 151 also receives image frames at a dynamic frame period $\Delta Fp$, e.g., 4 ms, 2 ms and 1 ms as shown in the second column of FIG. 4. Every time receiving one new image frame, the delta calculator 151 calculates a motion delta using the new image frame and a reference image frame, e.g., using correlation. It is seen from FIG. 4 that the delta calculator 151 also generates a motion delta every a dynamic frame period $\Delta Fp$, e.g., every 4 ms, 2 ms or 1 ms.

The delta regulator 152 receives and then splits the motion delta generated at the dynamic frame period $\Delta Fp$ to generate a split motion delta when the dynamic frame period $\Delta Fp$ is larger than a fixed period $\Delta t1$, and outputs the split motion delta at the fixed period $\Delta t1$ to the N-taps average circuit 153. FIG. 4 shows in the fourth column that the delta regulator 152 outputs a split motion delta every 1 ms (i.e. the fixed period) when a current frame period (selected from multiple predetermined frame periods) is larger than 1 ms.

For example, when a current frame period is equal to 4 ms, the delta calculator 151 outputs a motion delta every 4 ms, and the delta regulator 152 splits the motion delta to generate four motion delta, e.g., four 4-pixels distance herein, to output a split motion delta 4-pixels distance every 1 ms. For example, when a current frame period is equal to 2 ms, the delta calculator 151 outputs a motion delta every 2 ms, and the delta regulator 152 splits the motion delta to generate two motion delta, e.g., two 4-pixels distance herein, to output a split motion delta 4-pixels distance every 1 ms. The multiple split motion delta is stored in, for example, a line buffer temporarily before being outputted to the N-taps average circuit 153.

In the present disclosure, a number of the motion delta outputted from the delta calculator 151 being split is determined according to the fixed period $\Delta t1$ and a current frame period. And when a difference between the current frame period and the fixed period becomes smaller, the number of the motion delta being split is decreased. For example in FIG. 4, as the fixed period $\Delta t1$ is 1 ms, the motion delta is split into four split motion delta when the current frame period is equal to 4 ms, and the motion delta is split into two split motion delta when the current frame period is equal to 2 ms.

Further referring to FIG. 4, the delta regulator 152 further directly transfers the motion delta without being split to the N-taps average circuit 153 when the dynamic frame period is equal to the fixed period $\Delta t1$. For example, when both the dynamic frame period and the fixed period are 1 ms, the motion delta, e.g., 4-pixels distance, is directly transferred to the N-taps average circuit 153.

The N-taps average circuit 153 (taking N=8 as an example) receives the split motion delta every the fixed period $\Delta t1$ for 8 times and average the eight split motion delta. Every time the N-taps average circuit 153 obtains an averaged motion delta, e.g., by averaging eight split motion delta herein, the averaged motion delta, e.g., 4-pixels distance, is sent to the motion accumulator 154 based on $\Delta t2$. As shown in FIG. 4, after the N-taps average circuit 153 starts to output averaged motion delta, preferably $\Delta t2$ is equal to $\Delta t1$.

The accumulator 154 receives and accumulates the averaged motion delta before the accumulated motion delta is polled or read. In the present disclosure, the accumulated motion delta is polled at a polling period larger than the fixed period $\Delta t1$. For example in FIG. 4, an external MCU polls or reads the accumulator 154 every 8 ms, i.e. polling period=8 ms. The N-taps average circuit 153 generates an averaged motion delta every 1 ms (i.e. the fixed period $\Delta t2$), eight averaged motion delta are accumulated in the accumulator 154 within every polling period. To make the polled or outputted motion delta be in consistent with the motion of the navigation device 100, preferably the polling period is set as an integer times of the fixed period $\Delta t2$, e.g., 8-times herein.

Referring to FIG. 5, it is an operational schematic diagram of a moving average filter for a navigation device 100 according to an alternative embodiment of the present disclosure.

As mentioned above, the 2-stage moving average filter of the present disclosure includes the delta regulator 152 and the N-taps average circuit 153. The delta regulator 152 receives the motion delta, which is calculated by the delta calculator 151, at a dynamic frequency, e.g., 250 Hz, 500 Hz and 1000 Hz, and outputs a regulated motion delta at a fixed period Δt1, e.g., 2 ms in FIG. 5. The N-taps average circuit 153 receives the regulated motion delta every the fixed period Δt1 for N times and averages the N regulated motion delta, by calculating a sum of N regulated motion delta divided by N. FIG. 5 shows that the N-taps (N=4 for example) average circuit 153 outputs one averaged motion delta every 2 ms to the motion accumulator 154. The MCU also polls or reads the accumulated motion delta every 8 ms, i.e. polling period=8 ms.

In FIG. 5, the delta regulator 152 combines the motion delta as the regulated motion delta when the dynamic frame period ΔFp is smaller than the fixed period Δt1, e.g., ΔFp=1 ms. The delta regulator 152 further directly outputs the motion delta without being combined to the N-taps average circuit 154 when the dynamic frame period ΔFp is equal to the fixed period, e.g., ΔFp=2 ms.

In FIG. 5, the delta regulator 152 splits the motion delta as the regulated motion delta when the dynamic frame period ΔFp is larger than the fixed period Δt1, e.g., ΔFp=4 ms. The delta regulator 152 further directly outputs the motion delta without being split to the N-taps average circuit 153 when the dynamic frame period ΔFp is equal to the fixed period, e.g., ΔFp=2 ms.

In the present disclosure, a number of the motion delta being regulated (i.e. combined or split) is determined according to a difference between the fixed period Δt1 and the selected dynamic frame period ΔFp.

In FIGS. 3-5, the first column includes the dynamic frame rate of the image sensor 13, the second column includes the dynamic frame period of the image sensor 13, the third column includes the motion delta calculated by the delta calculator 151, the fourth column includes the regulated and not-regulated motion delta obtained by the delta regulator 152, the fifth column includes the averaged motion delta calculated by the N-taps average circuit 153 and sent to the motion accumulator 154, and the sixth column includes the polled or read motion delta outputted to the MCU 8 of an external computer system. Before the motion accumulator 154 is read, the accumulated motion delta is accumulated continuously. After the accumulator 154 is read, the motion accumulator 154 is reset and prepared to accumulate a next round of multiple averaged motion delta.

In the present disclosure, a predetermined relationship between a number of motion delta being regulated and dynamic frame periods is previously determined and recorded in the navigation device 100 before shipment, e.g., referring to FIGS. 3-5. During operation, if a current image frame is changed, the delta regulator 152 is switched to a corresponding operation including combining motion delta, splitting motion delta and determining a number of motion delta being combined or split.

In one non-limiting embodiment, a bypass path is connected between the delta calculator 151 and the N-taps average circuit 153 to bypass the delta regulator 152. For example, if the motion delta obtained by the delta calculator 151 is not regulated, e.g., ΔFp=4 ms in FIG. 3, ΔFp=1 ms in FIG. 4 and ΔFp=2 ms in FIG. 5, the delta calculator 151 is directly connected to the N-taps average circuit 153 via the bypass path. For example, the bypass operation is implemented by using a multiplexer or a switching device.

It should be mentioned that the values such as the frame periods, motion delta, fixed period, polling period and N mentioned above are only intended to illustrate but not to limit the present disclosure.

As mentioned above, when a conventional navigation device adopts a dynamic frame rate sensor, output motion delta can be inconsistent even though the navigation device moves in a steady movement. Accordingly, the present disclosure further provides a navigation device (e.g., FIG. 2) that adopts a 2-stage moving average filter to cause the motion delta to be sent to an accumulator having an unchanged number of times within a polling period when the frame rate is changed. In this way, the output motion delta polled by an external MCU is in consistent with the device movement.

Although the disclosure has been explained in relation to its preferred embodiment, it is not used to limit the disclosure. It is to be understood that many other possible modifications and variations can be made by those skilled in the art without departing from the spirit and scope of the disclosure as hereinafter claimed.

What is claimed is:

1. A navigation device, comprising:
an image sensor configured to output image frames based on a dynamic frame period;
a delta calculator configured to generate a motion delta at the dynamic frame period;
a delta regulator configured to combine the calculated motion delta generated at the dynamic frame period when the dynamic frame period is smaller than a fixed period, and output the combined motion delta at the fixed period;
an N-taps average circuit configured to receive the combined motion delta every fixed period for N times and average the N combined motion delta;
an accumulator connected downstream of the N-taps average circuit, and configured to receive and accumulate the averaged motion delta before the accumulated motion delta is polled at a polling period that is an integer times of the fixed period, wherein the polling period is larger than the fixed period; and
a bypass path, configured to bypass the delta regulator and directly connect the delta calculator to the N-taps average circuit when the dynamic frame period is equal to the fixed period.

2. The navigation device as claimed in claim 1, wherein a number of the calculated motion delta being combined has a predetermined relationship with the dynamic frame period.

3. The navigation device as claimed in claim 1, wherein a number of the calculated motion delta being combined is increased when a difference between the dynamic frame period and the fixed period becomes larger.

4. The navigation device as claimed in claim 1, wherein the accumulated motion delta is configured to control a cursor shown on a display at a constant speed when the motion delta has a constant value.

5. The navigation device as claimed in claim 1, wherein the bypass path is implemented by a multiplexer or a switch device.

6. A navigation device, comprising:
an image sensor configured to output image frames based on a dynamic frame period;
a delta calculator configured to generate a motion delta at the dynamic frame period;
a delta regulator configured to split the calculated motion delta generated at the dynamic frame period when the dynamic frame period is larger than a fixed period, and output the split motion delta at the fixed period;
an N-taps average circuit configured to receive the split motion delta every fixed period for N times and average the N split motion delta;

an accumulator connected downstream of the N-taps average circuit, and configured to receive and accumulate the averaged motion delta before the accumulated motion delta is polled at a polling period that is an integer times of the fixed period, wherein the polling period is larger than the fixed period; and a bypass path, configured to bypass the delta regulator and directly connect the delta calculator to the N-taps average circuit when the dynamic frame period is equal to the fixed period.

7. The navigation device as claimed in claim 6, wherein a number of the calculated motion delta being split has a predetermined relationship with the dynamic frame period.

8. The navigation device as claimed in claim 6, wherein a number of the calculated motion delta being split is decreased when a difference between the dynamic frame period and the fixed period becomes smaller.

9. The navigation device as claimed in claim 6, wherein the accumulated motion delta is configured to control a cursor shown on a display at a constant speed when the motion delta has a constant value.

10. The navigation device as claimed in claim 6, wherein the bypass path is implemented by a multiplexer or a switch device.

11. A 2-stage moving average filter for a navigation device, the 2-stage moving average filter being configured to receive motion delta, and comprising:

a delta regulator configured to receive the motion delta at a dynamic frame period and output a regulated motion delta at a fixed period; and an N-taps average circuit connected downstream of the delta regulator, and configured to receive the regulated motion delta every fixed period for N times and average the N regulated motion delta, wherein the averaged motion delta is configured to be accumulated by an accumulator of the navigation device before the accumulated motion delta is polled at a polling period that is an integer times of the fixed period, wherein the polling period is larger than the fixed period, and the motion delta is directly received by the N-taps average circuit to be averaged by bypassing the delta regulator with a bypass path when the dynamic frame period is equal to the fixed period.

12. The 2-stage moving average filter as claimed in claim 11, wherein the delta regulator is configured to combine the motion delta as the regulated motion delta when the dynamic frame period is smaller than the fixed period.

13. The 2-stage moving average filter as claimed in claim 11, wherein the delta regulator is configured to split the motion delta as the regulated motion delta when the dynamic frame period is larger than the fixed period.

14. The 2-stage moving average filter as claimed in claim 11, wherein a number of the calculated motion delta being regulated is determined according to a difference between the fixed period and the dynamic frame period.

15. The 2-stage moving average filter as claimed in claim 11, wherein the bypass path is implemented by a multiplexer or a switch device.

* * * * *